United States Patent
Kadowaki (10) Patent No.: US 11,393,656 B2
(45) Date of Patent: Jul. 19, 2022

(54) INSPECTION DEVICE

(71) Applicant: Kioxia Corporation, Tokyo (JP)

(72) Inventor: Motoki Kadowaki, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 9 days.

(21) Appl. No.: 17/161,927

(22) Filed: Jan. 29, 2021

(65) Prior Publication Data

US 2021/0287875 A1    Sep. 16, 2021

(30) Foreign Application Priority Data

Mar. 16, 2020 (JP) .............................. JP2020-045476

(51) Int. Cl.
*H01J 37/22*  (2006.01)
*H01J 37/20*  (2006.01)

(52) U.S. Cl.
CPC ............ *H01J 37/226* (2013.01); *H01J 37/20* (2013.01)

(58) Field of Classification Search
CPC ......... H01J 37/226; H01J 37/20; H01J 37/026
See application file for complete search history.

(56) References Cited

U.S. PATENT DOCUMENTS

| | | | | |
|---|---|---|---|---|
| 6,635,873 B1* | 10/2003 | Todokoro | .............. | H01J 37/026 250/397 |
| 7,977,632 B2* | 7/2011 | Todokoro | .............. | H01J 37/026 250/311 |
| 8,519,334 B2* | 8/2013 | Tadaka | .................... | H01J 37/28 250/306 |
| 8,779,359 B2* | 7/2014 | Ogiso | ..................... | G06T 7/001 250/307 |
| 2009/0039259 A1* | 2/2009 | Todokoro | ................ | H01J 37/28 250/311 |
| 2013/0245989 A1* | 9/2013 | Kadowaki | ............. | H01J 37/222 702/150 |
| 2016/0266191 A1* | 9/2016 | Kadowaki | ............... | H01L 22/12 |

FOREIGN PATENT DOCUMENTS

JP    2018-041737 A    3/2018

* cited by examiner

*Primary Examiner* — David A Vanore
(74) *Attorney, Agent, or Firm* — Oblon, McClelland, Maier & Neustadt, L.L.P.

(57) ABSTRACT

According to one embodiment, an inspection device includes: a lens barrel that irradiates a substrate having a first main surface on which a pattern is formed with a charged particle; a terminal that comes into contact with the substrate at a first site on a second main surface of the substrate or on a side surface of the substrate and applies a predetermined potential to the substrate; and at least one light source that irradiates a predetermined area of the substrate including the first site with light.

20 Claims, 8 Drawing Sheets

INSPECTION DEVICE

CROSS-REFERENCE TO RELATED APPLICATIONS

This application is based upon and claims the benefit of priority from Japanese Patent Application No. 2020-045476, filed on Mar. 16, 2020; the entire contents of which are incorporated herein by reference.

FIELD

Embodiments of the present invention described herein relate generally to an inspection device.

BACKGROUND

There is known an inspection device that irradiates a substrate with charged particles to inspect a pattern or the like formed on the substrate in a manufacturing process of a semiconductor device or the like. During such an inspection, for example, a pin whose one end is grounded is sometimes brought into contact with a back surface of the substrate in order to keep the substrate at a predetermined potential.

However, there is a case where it is difficult to keep the substrate at the predetermined potential via the back surface, for example, if a thick insulating film or the like is formed on the back surface of the substrate.

DETAILED DESCRIPTION

An inspection device according to an embodiment includes: a lens barrel that irradiates a substrate having a first main surface on which a pattern is formed with a charged particle; a terminal that comes into contact with the substrate at a first site on a second main surface of the substrate or on a side surface of the substrate and applies a predetermined potential to the substrate; and at least one light source that irradiates a predetermined area of the substrate including the first site with light.

Hereinafter, embodiments of the present invention will be described in detail with reference to the drawings. Incidentally, the present invention is not limited to the following embodiments. In addition, constituent elements in the following embodiments include those that can be easily assumed by those skilled in the art or those that are substantially the same.

First Embodiment

Hereinafter, a first embodiment will be described in detail with reference to the drawings.

(Configuration Example of Inspection Device)

Figure 1:
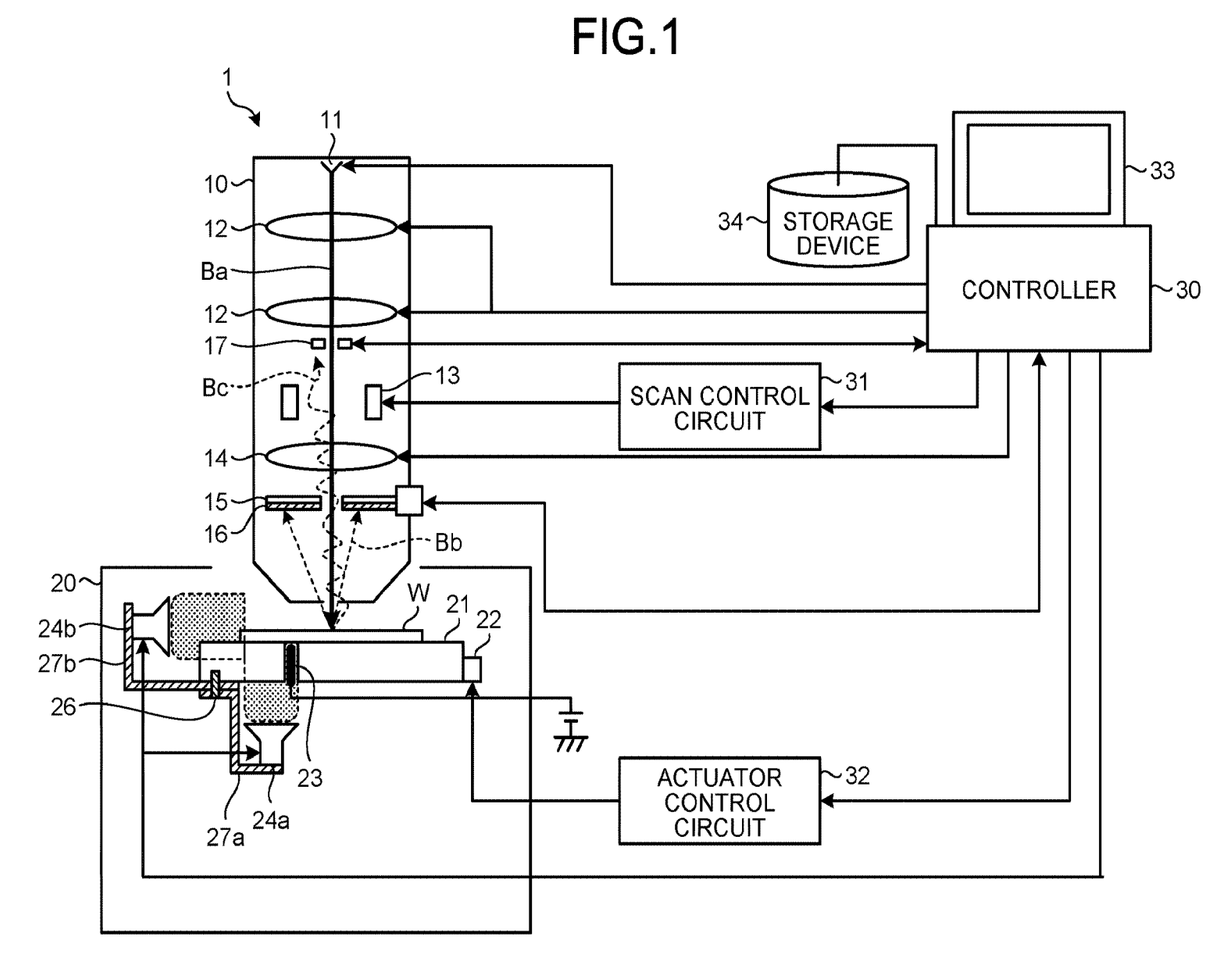
FIG. 1 is a schematic view illustrating an example of a configuration of an inspection device according to a first embodiment.

FIG. 1 is a schematic view illustrating an example of a configuration of an inspection device 1 according to the first embodiment. The inspection device 1 of the first embodiment can inspect a pattern (not illustrated) formed on a wafer W by irradiating the wafer W with charged particles such as electrons. Examples of this inspection device 1 include a critical dimension-scanning electron microscope (CD-SEM) that measures a dimension of a pattern, a voltage contrast (VC) inspection device that performs VC inspection using potential contrast, a defect review SEM, which inspects a defect occurring in a pattern, a focused ion beam (FIB) device that observes a pattern, and the like.

As illustrated in FIG. 1, the inspection device 1 includes: a lens barrel 10 in which an electron gun 11 as an electron beam irradiation source is installed; a sample chamber 20 in which a wafer W as a substrate is arranged; and a controller 30 as a control device that controls each part of the inspection device 1.

The lens barrel 10 has a tubular shape including a closed upper end portion and an open lower end portion configured to transmit an electron beam or the like. The sample chamber 20 can accommodate the wafer W. The lens barrel 10 and the sample chamber 20 are combined in an airtightly sealed state. The inside of the lens barrel 10 and the inside of the sample chamber 20 can be held under reduced pressure by a pump or the like (not illustrated).

In addition, the lens barrel 10 is installed so as to stand upright with respect to the sample chamber 20, and an optical axis along the longitudinal direction of the lens barrel 10 is substantially orthogonal to the wafer W inside the sample chamber 20.

The electron gun 11, a focusing lens 12, coils 13, and an objective lens 14 are installed in the lens barrel 10 in this order from the vicinity of the upper end portion of the lens barrel 10. A lower detector 15 and a filter 16 are installed further below the objective lens 14, and an upper detector 17 is installed between the focusing lens 12 and the coil 13.

The electron gun 11 emits an incident electron beam Ba, to be incident on the wafer W, toward the lower side inside the lens barrel 10.

The focusing lens 12 is an electromagnetic coil wound concentrically around the optical axis of the lens barrel 10 and focuses the incident electron beam Ba by a magnetic field.

The coils 13 are two electromagnetic coils forming a pair to deflect the incident electron beam Ba, and are arranged symmetrically with respect to the optical axis of the lens barrel 10. As a result, the coil 13 deflects the incident electron beam Ba to move a position on the wafer W.

The objective lens 14 is an electromagnetic coil wound concentrically around the optical axis of the lens barrel 10 and focuses the incident electron beam Ba emitted toward the wafer W by a magnetic field.

The lower detector 15 and the upper detector 17 detect emission electron beams Bb and Bc emitted from the wafer W. The filter 16 guides a desired electron beam among the emission electron beams to the lower detector 15. Examples of objects to be detected by the lower detector 15 and the upper detector 17 include a secondary electron emitted when a primary electron from the lens barrel 10 collides with a front surface or the like of the wafer W surface and a reflected electron generated as the primary electron from the lens barrel 10 is reflected on the front surface or the like of the wafer W.

With these emission electron beams Bb and Bc, the inspection device 1 can obtain information from the wafer W and inspect a pattern formed on the wafer W.

A wafer stage 21 on which the wafer W is placed is installed inside the sample chamber 20. An actuator 22 is attached to the wafer stage 21, and the wafer stage 21 can be driven back and forth, and left and right. As the wafer stage 21 is driven back and forth, and left and right, it is possible to irradiate a predetermined point on the wafer W with the incident electron beam Ba. At this time, the coil 13 deflects the incident electron beam Ba, so that the wafer W is scanned by the incident electron beam Ba with which the predetermined point has been irradiated.

In addition, a contact pin 23 as a terminal, which comes into contact with the wafer W on a back surface and applies a predetermined potential, penetrates the wafer stage 21. The contact pin 23 is made of metal such as titanium, and is grounded at one end, for example. Therefore, the predetermined potential applied by the contact pin 23 to the wafer W may be, for example, a reference potential, or may be a ground potential, for example. The other end of the contact pin 23 is located at substantially the same height as a surface of the wafer stage 21 on which the wafer W is placed, or at a position slightly higher than the placement surface of the wafer stage 21. As a result, the contact pin 23 comes into contact with the back surface of the wafer W placed on the wafer stage 21.

Light sources 24a and 24b are installed around the wafer stage 21 inside the sample chamber 20. More specifically, the light sources 24a and 24b are mounted on the wafer stage 21 by support members 27a and 27b fixed to the wafer stage 21 by a fixing member 26, for example.

That is, the support member 27a is fixed to, for example, the back surface of the wafer stage 21 by the fixing member 26, and extends to the lower side of the wafer stage 21. The light source 24a is fixed to an end portion of the support member 27a below the wafer stage 21. As a result, the light source 24a is arranged below the wafer stage 21 and irradiates the back surface of the wafer W with light through the wafer stage 21. The support member 27b is fixed to, for example, the back surface of the wafer stage 21 by the fixing member 26, and extends to the lateral side of the wafer stage 21. The light source 24b is fixed to an end portion of the support member 27b on the lateral side of the wafer stage 21. As a result, the light source 24b is arranged on the lateral side of the wafer stage 21 and irradiates a side surface of the wafer W with light. Part of the light from the light source 24b may irradiate the wafer W through the wafer stage 21. A configuration of the wafer stage 21 capable of emitting light through the wafer stage 21 will be described later.

The light emitted from the light sources 24a and 24b is, for example, laser light having arbitrary wavelength from red light in a visible region to an infrared region. The light from the light sources 24a and 24b is emitted to the wafer W, for example, when the wafer W is irradiated with the incident electron beam Ba and the wafer W is inspected.

The controller 30 is configured as a computer including, for example, a central processing unit (CPU), a random access memory (RAM), a read only memory (ROM), and the like. The RAM, the ROM, and the like are configured such that data can be exchanged with the CPU via an internal bus.

The CPU of the controller 30 reads a control program from the ROM and controls the electron gun 11, the focusing lens 12, the coil 13, the objective lens 14, the lower detector 15, the upper detector 17, the actuator 22 of the wafer stage 21, the light sources 24a and 24b, and the like so as to follow contents of the read control program. At this time, the coil 13 is controlled via, for example, a scan control circuit 31 connected to the controller 30. The actuator 22 is controlled, for example, via an actuator control circuit 32 connected to the controller 30.

In addition, the CPU of the controller 30 acquires detection signals of the emission electron beams Bb and Bc from the lower detector 15 and the upper detector 17. The CPU analyzes information on a pattern and the like formed on the wafer W based on the acquired detection signal and the like.

The controller 30 is connected with a television monitor 33 as a display device. The controller 30 may be connected with a printer (not illustrated) or the like as another output device. Such output devices output, for example, an inspection condition in the inspection device 1 and an inspection result of the wafer W obtained by the inspection device 1.

The controller 30 may be connected with a keyboard, a mouse (not illustrated), and the like as input devices. From such input devices, for example, an instruction or the like from a user to the controller 30 is input.

In addition, the controller 30 is connected with a storage device 34. The storage device 34 is, for example, a flash memory, a hard disk drive (HDD), or the like. The storage device 34 stores the inspection condition in the inspection device 1 and the inspection result of the wafer W obtained by the inspection device 1.

Figure 2A:
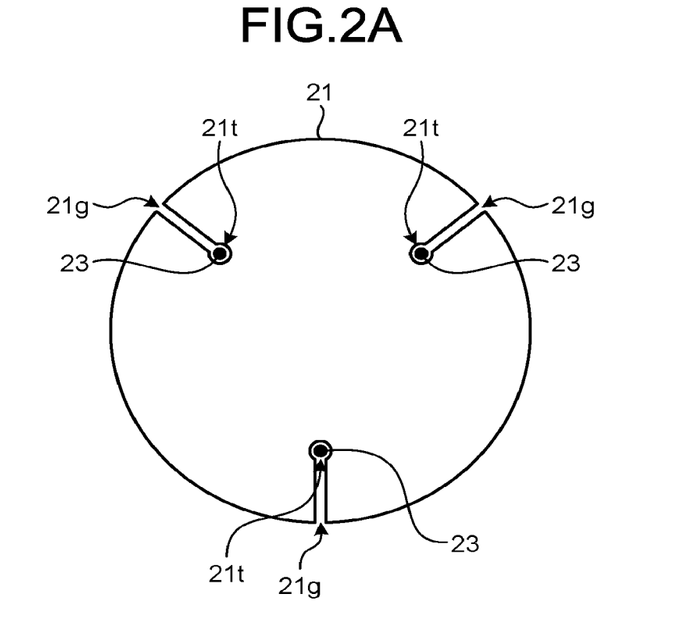
FIGS. 2A and 2B are plan views of a wafer stage provided in the inspection device according to the first embodiment.
Figure 2B:
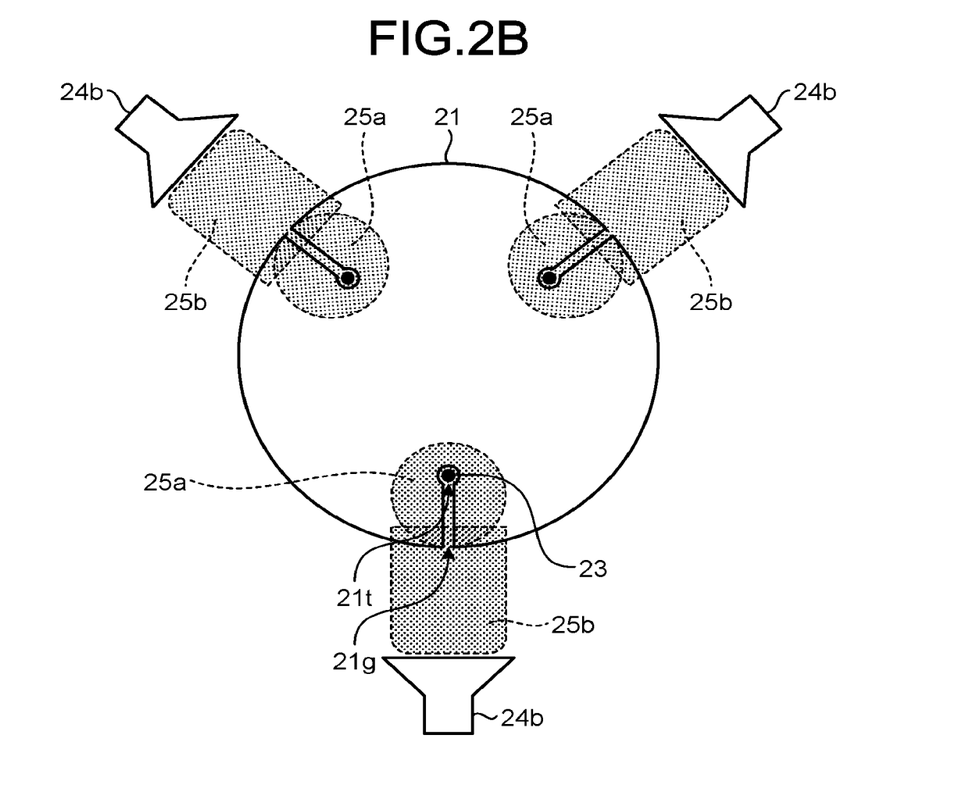

FIGS. 2A and 2B are plan views of the wafer stage 21 provided in the inspection device 1 according to the first embodiment. FIGS. 2A and 2B illustrate an upper surface of the wafer stage 21 on which the wafer W is placed, that is, the placement surface.

As illustrated in FIG. 2A, the wafer stage 21 includes through holes 21t and through grooves 21g. In the example of FIG. 2A, the wafer stage 21 includes three through holes 21t and three through grooves 21g. However, the number of the through holes 21t and the number of the through grooves 21g may be one, two or four or more.

The three through holes 21t are provided at substantially equal distances from a center of the wafer stage 21 and at substantially equal intervals from each other. Each of the through holes 21t penetrates the wafer stage 21 in the thickness direction of the wafer stage 21. The above-described contact pin 23 is arranged in each of the through holes 21t.

The three through grooves 21g extend from the respective through holes 21t to an outer edge of the wafer stage 21 along a line extending radially from the center of the wafer stage 21. Each of the through grooves 21g penetrates the wafer stage 21 in the thickness direction of the wafer stage 21, and has one end extending to the outer edge of the wafer stage 21 and leading to the outside of the wafer stage 21.

With such a configuration, the above-described light sources 24a and 24b can irradiate the wafer W with light through the wafer stage 21.

As illustrated in FIG. 2B, light 25a from the light source 24a (see FIG. 1) below the wafer stage 21 is emitted to the back surface of the wafer W through the through hole 21*t* and the through groove 21*g* of the wafer stage 21. In addition, the side surface of the wafer W is irradiated with part of light 25*b* from the light source 24*b* on the lateral side of the wafer stage 21 directly and with part of the light 25*b* through the through groove 21*g* of the wafer stage 21.

Incidentally, the light sources 24*a* and 24*b* may be arranged at one or more points corresponding to any of the through holes 21*t* and the through grooves 21*g*, and may be arranged at a plurality of points as in the example of FIG. 2B.

(Operation Example of Inspection Device)

Figures 3A, 3C:
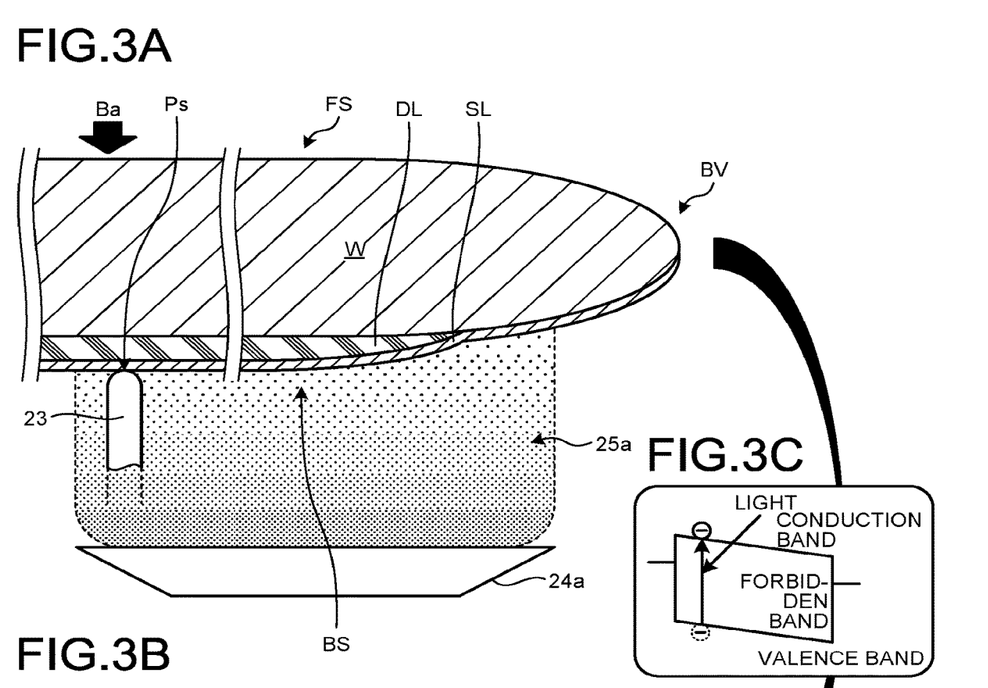
FIGS. 3A to 3C are schematic views illustrating a principle of the inspection device according to the first embodiment.
Figure 3B:
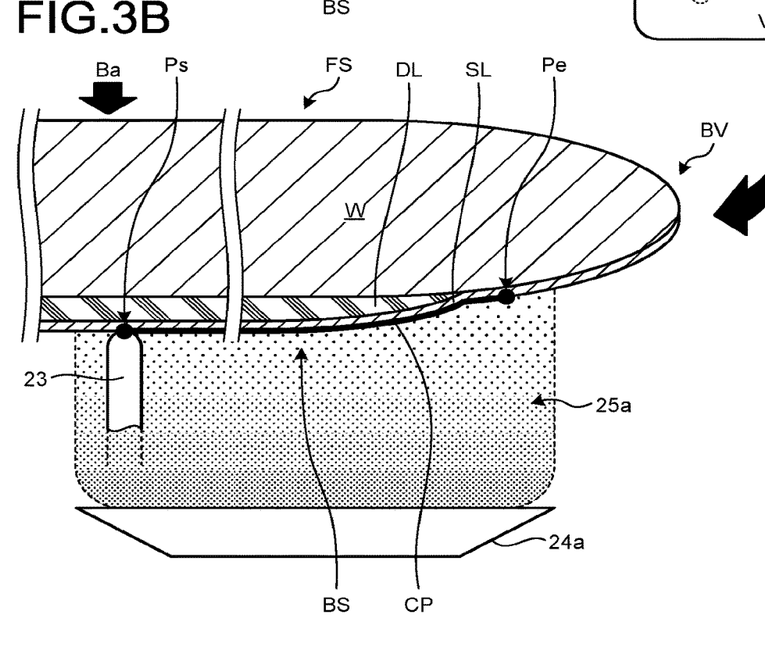

Next, an operation example of the inspection device 1 of the first embodiment will be described with reference to FIGS. 3A to 5B. FIGS. 3A to 3C are schematic views illustrating a principle of the inspection device 1 according to the first embodiment.

FIG. 3A illustrates an example of the wafer W to be inspected by the inspection device 1. FIG. 3A is a partial cross-sectional view of the wafer W irradiated with the light 25*a* from the light source 24*a* of the inspection device 1.

As illustrated in FIG. 3A, the wafer W as the substrate has a front surface (element formation surface) FS as a first main surface, a back surface BS as a second main surface, and a bevel BV as a side surface formed to straddle the front surface FS and the back surface BS. The bevel BV has, for example, a rounded U-shaped cross section.

A body portion of the wafer W is configured using, for example, a semiconductor such as silicon, germanium, and gallium arsenide or a conductor such as conductive alumina ($Al_2O_3$) and diamond.

A pattern (not illustrated) to be inspected by the inspection device 1 is formed on the front surface FS of the wafer W. A semiconductor film SL is formed on the back surface BS of the wafer W via an insulating film DL having a predetermined thickness. However, the insulating film DL does not reach the vicinity of the outer edge of the wafer W. On the other hand, the semiconductor film SL reaches, for example, the vicinity of the bevel BV of the wafer W, and is in direct contact with the wafer W in the vicinity of the bevel BV. The wafer W may have such a configuration by undergoing a plurality of processes.

The insulating film DL is configured using, for example, a $SiO_2$ film or a SiN film. The insulating film DL may have a configuration in which a plurality of identical or different types of insulating films are stacked. A conductive film such as a polysilicon film may be interposed among the plurality of insulating films. In either case, the total thickness of the insulating film such as the $SiO_2$ film or the SiN film in the insulating film DL is, for example, 1500 nm or more, and the insulating film DL as a whole exhibits insulating properties. The insulating film DL covers the entire back surface BS of the wafer W except for the vicinity of the bevel BV, for example.

The semiconductor film SL is configured using, for example, a non-doped amorphous silicon film or the like. The semiconductor film SL roughly covers the entire insulating film DL, and at least a part thereof extends from an outer edge of the insulating film DL to the vicinity of the bevel BV of the wafer W and has an area in direct contact with the wafer W. Here, the semiconductor film SL may completely cover the entire insulating film DL. The area in which the semiconductor film SL is in direct contact with the wafer W may extend over the entire circumference of the wafer W. The thickness of the semiconductor film SL is, for example, 30 nm or more.

In the present specification, a body of the wafer W, which is a semiconductor or a conductor, is sometimes referred to as the wafer W or the substrate, and the body of the wafer W, the insulating film DL, and the semiconductor film SL are sometimes referred to collectively as the wafer W or the substrate.

In the inspection device 1, the wafer W is placed on the wafer stage 21 (see FIG. 1) and is in contact with the contact pin 23 exposed from the through hole 21*t* (see FIGS. 2A and 2B) of the wafer stage 21 on the back surface BS.

The inspection device 1 irradiates the front surface FS of the wafer W with the incident electron beam Ba from the electron gun 11 to inspect the front surface FS of the wafer W (see FIG. 1). At this time, the back surface BS of the wafer W is irradiated with at least the light 25*a* from the light source 24*a* through the through hole 21*t* and the through groove 21*g* (see FIGS. 2A and 2B) of the wafer stage 21. An area irradiated with the light 25*a* on the back surface BS of the wafer W includes a point Ps as a first site where the contact pin 23 and the wafer W are in contact with each other and at least a part of the area where the semiconductor film SL and the wafer W are in direct contact with each other. The point Ps is located in an area where the semiconductor film SL is formed on the wafer W with the insulating film DL interposed therebetween, and is a point where the wafer W and the contact pin 23 are in contact with each other as described above.

As illustrated in FIG. 3C, when the wafer W is irradiated with the light 25*a*, an internal photoelectric effect is generated on the semiconductor film SL in the area irradiated with the light 25*a*.

The internal photoelectric effect is a phenomenon in which electrons in a valence band inside a substance absorb energy of photons and are excited into a conduction band jumping over a forbidden band when a semiconductor or an insulator is irradiated with sufficiently high-energy light such as short-wavelength light. Holes are generated in the valence band from which the electrons have escaped, and the electrons excited into the conduction band become conduction electrons. These conduction electrons and holes increase the conductivity of the substance In the semiconductor film SL whose conductivity has increased due to the internal photoelectric effect, even if the semiconductor film SL is made of a non-doped silicon that is not doped with any impurity, a conduction path CP is formed from the point Ps in contact with the contact pin 23 to a point Pe as a second site where the semiconductor film SL is in direct contact with the wafer W as illustrated in FIG. 3B. The point Pe is located in the area irradiated with the light 25*a* from the light source 24*a* in the area where the semiconductor film SL is in direct contact with the wafer W, and is an arbitrary point where the semiconductor film SL and the wafer W are made conductive.

As a result, the conduction from the contact pin 23 to the body of the wafer W, which is the semiconductor or the conductor, is obtained, and the predetermined potential is applied from the contact pin 23 to the body of the wafer W. Accordingly, the wafer W is fixed at the predetermined potential during the inspection by the inspection device 1.

Here, the conduction path CP is temporarily formed only while the semiconductor film SL is irradiated with the light 25*a* from the light source 24*a*. Therefore, the irradiation of the semiconductor film SL with the light 25*a* from the light source 24*a* is continued while the inspection by the inspection device 1 is performed.

In addition, the wafer stage 21 repeats the movement in the state where the wafer W is placed while the inspection by the inspection device 1 is performed. As described above, the light source 24*a* is mounted on, for example, the wafer stage 21 and moves following the movement of the wafer stage 21. Therefore, with a simple configuration of the support member 27*a* or the like, an irradiation position of the light 25*a* from the light source 24*a* can be maintained constant in conjunction with the movement of the wafer stage 21. Accordingly, the formed conduction path CP is maintained without disappearing while the inspection is performed.

Figure 4A:
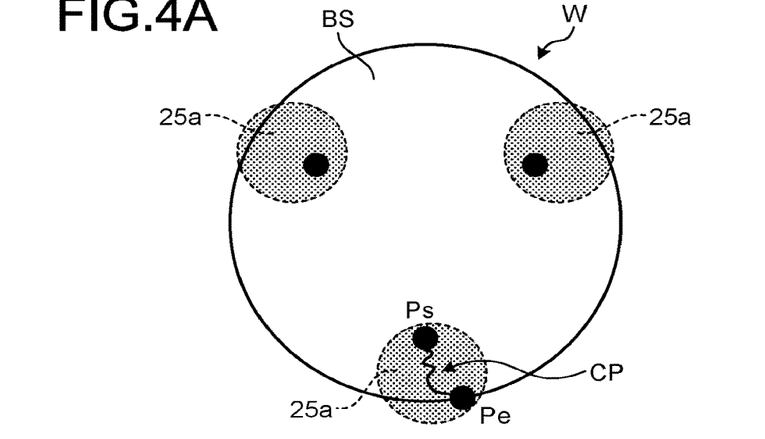
FIGS. 4A to 4C are schematic views illustrating an example of a conduction path generated in a wafer by the inspection device according to the first embodiment.
Figure 4B:
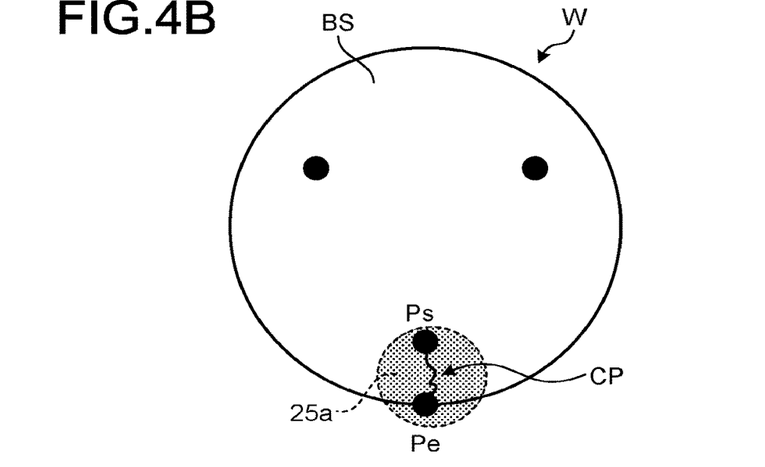
Figure 4C:
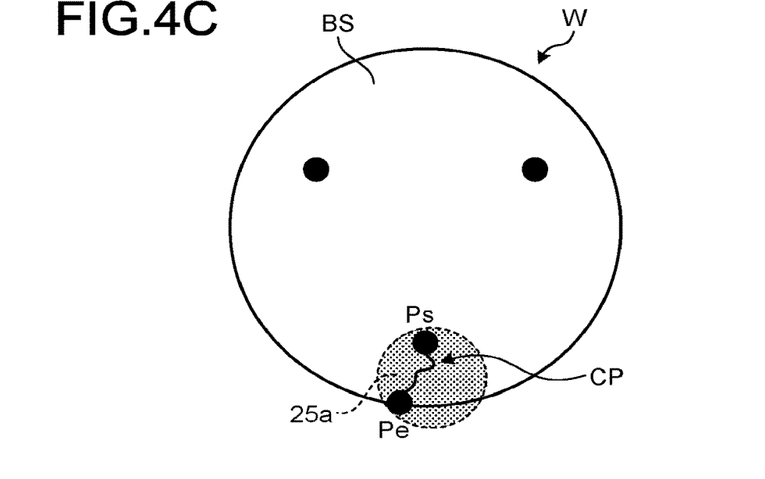

FIGS. 4A to 4C are schematic views illustrating an example of the conduction path CP generated in the wafer W by the inspection device 1 according to the first embodiment. FIGS. 4A to 4C illustrate the back surface BS of the wafer W in which the conduction path CP is generated.

As illustrated in FIG. 4A, it suffices to obtain the conduction path CP connected to the point Pe at at least one location out of the above-described locations where the contact pins 23 come into contact with the wafer W during the inspection by the inspection device 1.

As illustrated in FIGS. 4A to 4C, the position of the point Pe is arbitrarily selected in the area where the semiconductor film SL is in direct contact with the wafer W, and in the area irradiated with the light 25*a* from the light source 24*a*. The conduction path CP is also arbitrarily selected from among a plurality of paths connecting the points Ps and Pe. The conduction path CP is not necessarily the shortest path connecting the points Ps and Pe, and may be the shortest path. It is considered that the conduction path CP is formed between the points Ps and Pe, probably as a result of continuous selection of paths with lower resistance within a small distance of the semiconductor film SL.

However, in any case, it is noted that the points Ps and Pe and the conduction path CP are all included in the area irradiated with the light 25*a* from the light source 24*a*. At this time, the light source 24*b* may be used together to widen the entire irradiation area. In that case, the area irradiated with the light 25*a* from the light source 24*a* and an area irradiated with the light from the light source 24*b* continuously overlap with each other. As a result, the site where the semiconductor film SL comes into contact with the contact pin 23 and the area where the semiconductor film SL comes into direct contact with the wafer W are more reliably included in the irradiation area so that the point Ps and Pe and the conduction path CP are easily formed.

When the light source 24*b* is used together, for example, the light source 24*b* is also mounted on the wafer stage 21, and thus, it is possible not only to maintain an irradiation position of the light 25*b* from the light source 24*b* constant but also to maintain the positional relationship with the irradiation position of the light 25*a* from the light source 24*a* constant, and the formed conduction path CP can be prevented from disappearing.

Figure 5A:
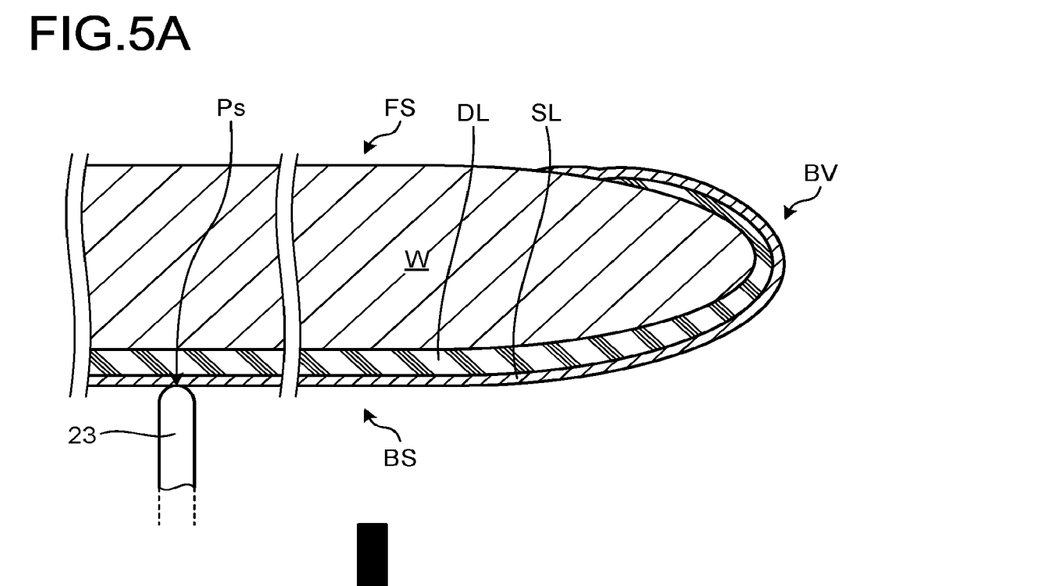
FIGS. 5A and 5B are schematic views illustrating another example of the wafer to be inspected by the inspection device according to the first embodiment.
Figure 5B:
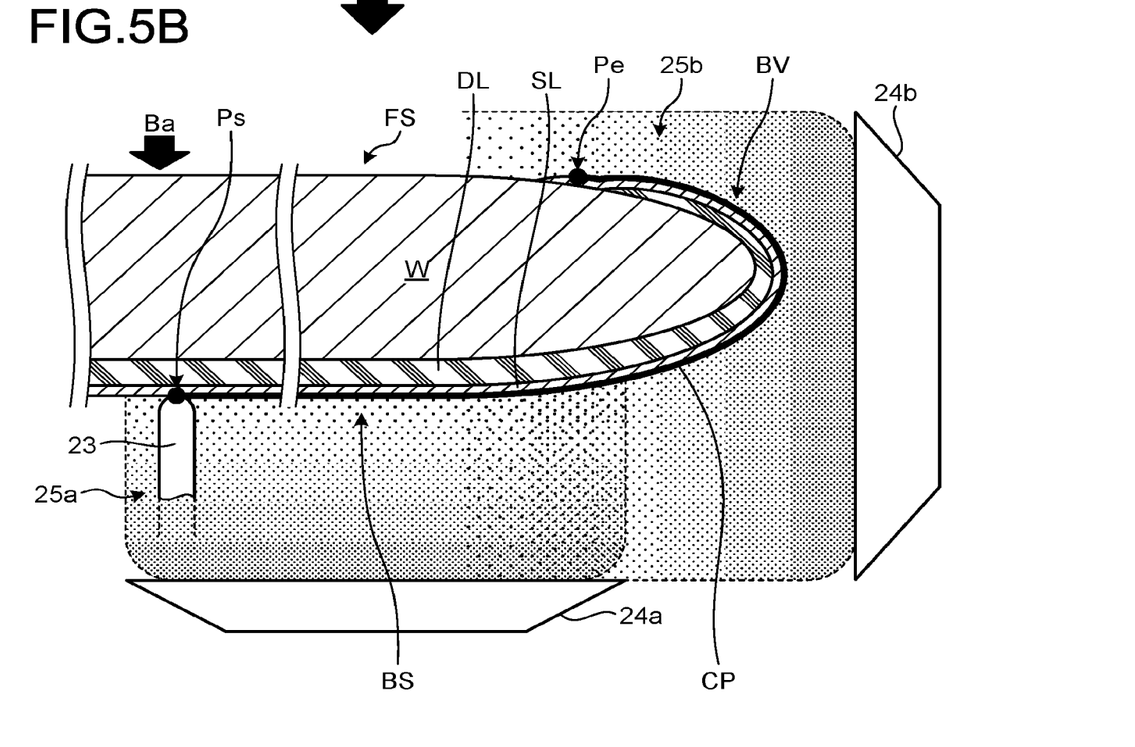

An example of the case where the light sources 24*a* and 24*b* are used together is illustrated in FIGS. 5A and 5B.

FIGS. 5A and 5B are schematic views illustrating another example of the wafer W to be inspected by the inspection device 1 according to the first embodiment. In the wafer W illustrated in the example of FIG. 5A, the insulating film DL wraps around the bevel BV from the back surface BS of the wafer W and reaches the vicinity of the front surface FS of the wafer W. The semiconductor film SL covers an end portion of the insulating film DL on the front surface FS side of the wafer W and further extends to the inner side of the front surface FS of the wafer W, thereby having an area in direct contact with the wafer W.

The wafer W may have such a configuration as, for example, a bevel cut process is not applied to the wafer W that has undergone a plurality of processes.

As illustrated in FIG. 5B, for example, the light sources 24*a* and 24*b* are used together with respect to the wafer W having such a configuration. At this time, the light 25*a* from the light source 24*a* is emitted to the back surface BS of the wafer W through the through hole 21*t* and the through groove 21*g* of the wafer stage 21, and the light 25*b* from the light source 24*b* is mainly emitted to the bevel BV of the wafer W. Here, the wafer W is irradiated with part of the light 25*b* from the light source 24*b* through the through groove 21*g* of the wafer stage 21 and directly with the other part of the light 25*b*, so that the light 25*b* from the light source 24*b* is emitted to a partial area of the back surface BS and a partial area of the front surface FS of the wafer W.

As a result, the point Ps of the back surface BS of the wafer W where the semiconductor film SL and the contact pin 23 are in contact with each other, and the area of the front surface FS of the wafer W where the semiconductor film SL and the wafer W are in direct contact with each other are included in the area continuously irradiated with the light 25*a* and the light 25*b* from the light sources 24*a* and 24*b*.

Therefore, electrons in the semiconductor film SL in these continuously irradiated areas are excited so that the conductivity of the semiconductor film SL increases. Accordingly, the points Ps and Pe and the conduction path CP connecting them are formed even if the semiconductor film SL is made of a non-doped silicon that is not doped with any impurity.

Incidentally, the area in which the semiconductor film SL and the wafer W come into direct contact with each other may be located in the bevel BV of the wafer W, and in this case, the point Pe is formed in the bevel BV.

In addition, there is also a case where the wafer W does not have the semiconductor film SL on the outermost surface regardless of the above-described examples in FIGS. 3A to 3C and 5A and 5B. Even in this case, the inspection by the inspection device 1 can be performed by forming the continuous semiconductor film SL, which extends from a site which the insulating film DL is formed and serving as a contact position with the contact pin 23 to an area where the insulating film DL is not formed and the body of the wafer W is exposed.

(Example of Inspection Process Performed by Inspection Device)

Figure 6:
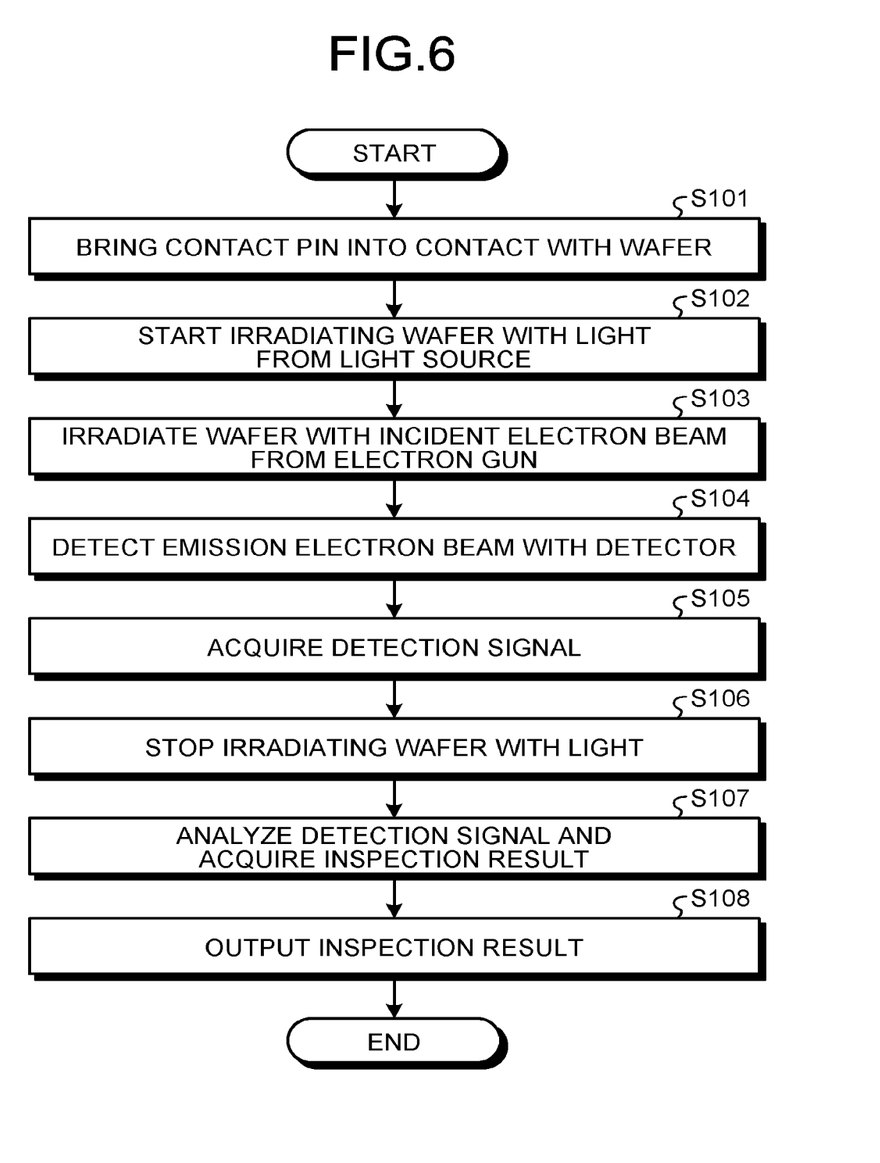
FIG. 6 is a flowchart illustrating an example of a procedure of an inspection process performed by the inspection device according to the first embodiment.

Next, an example of an inspection process performed by the inspection device 1 of the first embodiment will be described with reference to FIG. 6. FIG. 6 is a flowchart illustrating an example of a procedure of the inspection process performed by the inspection device 1 according to the first embodiment.

As illustrated in FIG. 6, the controller 30 of the inspection device 1 brings the contact pin 23 into contact with the wafer W (Step S101). That is, the controller 30 places the wafer W on the wafer stage 21 by a transfer system or the like (not illustrated). As a result, the contact pin 23 exposed on the placement surface of the wafer stage 21 comes into contact with the back surface BS of the wafer W.

The controller 30 starts irradiating the wafer W with light from at least the light source 24*a* (Step S102). At this time, the controller 30 may irradiate the wafer W even with light from the light source 24*b*, as needed, based on the arrangement of the insulating film DL and the semiconductor film SL provided in the wafer W.

The controller 30 irradiates the front surface FS of the wafer W on which a pattern has been formed with an incident electron beam from the electron gun 11 (Step S103). An emission electron beam containing pattern information is emitted from the wafer W.

The controller 30 detects the emission electron beam from the wafer W by at least one of the lower detector 15 and the upper detector 17 (Step S104). The controller 30 acquires a detection signal of the emission electron beam from the lower detector 15 and the upper detector 17 (Step S105).

At this timing, for example, the controller 30 stops irradiating the wafer W with the light from the light source 24a (Step S106). When the light source 24b is used together, the irradiation with light from the light source 24b is also stopped. However, the timing for stopping the irradiation with the light from the light sources 24a and 24b may be another timing after the emission electron beam is detected by the lower detector 15 and the upper detector 17.

The controller 30 analyzes the detection signal and acquires an inspection result of the pattern of the wafer W (Step S107). The controller 30 outputs the inspection result by displaying the inspection result on the television monitor 33 (Step S108).

As a result, the inspection process performed by the inspection device 1 of the first embodiment is completed.

In a wafer inspection device using charged particles or the like, for example, a grounded contact pin is brought into contact with a back surface of a wafer, and inspection is performed with a potential of the wafer fixed.

However, there is a case where it is difficult to stably fix the potential of the wafer via the contact pin if a thick insulating film is formed on the back surface of the wafer that has undergone various processes. If the potential of the wafer is unstable, for example, an inspection image of the wafer obtained from the charged particles becomes unclear or a drift phenomenon in which an observation image of the wafer slowly moves on a monitor occurs, so that the inspection accuracy deteriorates.

Meanwhile, there is a case where a contact mark with the contact pin remains on the back surface of the wafer if an attempt is made to stabilize the wafer potential by increasing the number of contact pins, increasing the contact pressure with the wafer, increasing the electrical energy, or the like. There is a possibility that the contact mark on the back surface of the wafer may cause a processing defect in the subsequent lithography process or the like.

According to the inspection device 1 of the first embodiment, a predetermined area of the wafer W including the point Ps with which the contact pin 23 comes into contact is irradiated with light by at least one light source 24a. As a result, the internal photoelectric effect is generated in the semiconductor film SL, the conductivity of the semiconductor film SL increases, and the contact pin 23 and the body of the wafer W can be made conductive. Accordingly, it is easy to keep the wafer W at the predetermined potential even when the thick insulating film DL is formed on the back surface BS. It is also possible to suppress generation of the contact mark with the contact pins 23 on the wafer W.

According to the inspection device 1 of the first embodiment, the wafer stage 21 includes the through hole 21t and the through groove 21g. As a result, the wafer W can be irradiated with light through these through hole 21t and through groove 21g.

According to the inspection device 1 of the first embodiment, the light source 24a arranged below the wafer stage 21 and the light source 24b arranged on the lateral side of the wafer stage 21 are provided. As a result, a wider range of area of the wafer W can be irradiated, and the points Ps and Pe and the conduction path CP connecting them can be formed more reliably.

According to the inspection device 1 of the first embodiment, the light sources 24a and 24b emit light to the points Ps on the back surface BS of the wafer W and at least a part of the area where the semiconductor film SL and the wafer W come into direct contact with each other on the back surface BS, the bevel BV, or the front surface FS of the wafer W. As a result, the points Ps and Pe and the conduction path CP connecting them can be formed in the irradiation area.

According to the inspection device 1 of the first embodiment, the irradiation area, which includes the point Ps on the back surface BS of the wafer W and at least a part of the area where the semiconductor film SL and the wafer W come into direct contact with each other on the back surface BS, the bevel BV, or the front surface FS of the wafer W, is continuously formed by the light 25a and the light 25b from the light sources 24a and 24b. As a result, the points Ps and Pe and the conduction path CP connecting them can be formed in the irradiation area.

Second Embodiment

Figure 7:
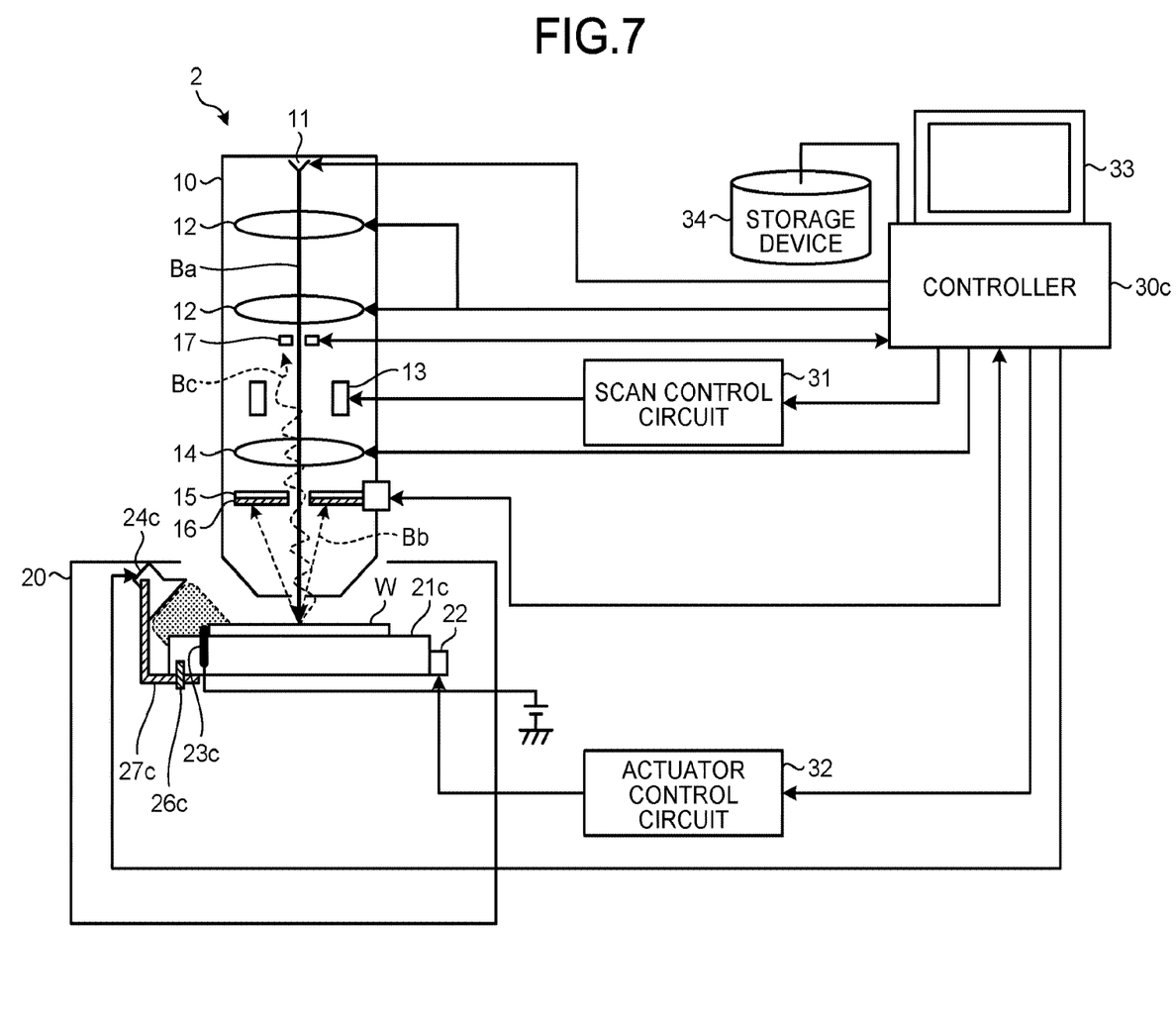
FIG. 7 is a schematic view illustrating an example of a configuration of an inspection device according to a second embodiment.

Hereinafter, a second embodiment will be described in detail with reference to the drawings. An inspection device 2 of the second embodiment includes a contact pin 23c that comes into contact with the wafer W at a position different from that of the contact pin 23 of the inspection device 1 according to the first embodiment described above, and a light source 24c that irradiates the wafer W with light from a position different from those of the light sources 24a and 24b.

FIG. 7 is a schematic view illustrating an example of a configuration of the inspection device 2 according to the second embodiment. As illustrated in FIG. 7, the inspection device 2 includes: a wafer stage 21c on which the wafer W is placed; the light source 24c that irradiates the wafer W with light; and a controller 30c as a control device that controls each part of the inspection device 2.

The wafer stage 21c includes the contact pin 23c as a terminal that comes into contact with the wafer W on a side surface and applies a predetermined potential, in place of or in addition to the above-described contact pin 23.

The contact pin 23c is arranged near an outer edge of the wafer stage 21c so as to protrude from a placement surface of the wafer W. More specifically, the contact pin 23c is arranged on the placement surface of the wafer stage 21c at a position where contact can be made with the side surface of the wafer W mounted on the wafer stage 21. The contact pin 23c is also made of metal such as titanium and is grounded at one end, for example.

One or more contact pins 23c may be provided similarly to the contact pin 23 of the first embodiment described above.

The light source 24c arranged obliquely above the wafer stage 21c is installed in the sample chamber 20, in place of or in addition to the above-described light sources 24a and 24b. More specifically, a support member 27c is fixed to, for example, a back surface of the wafer stage 21c by a fixing member 26c, and extends upward from a lateral side of the wafer stage 21c. The light source 24c is fixed to an end portion of the support member 27c above the wafer stage 21c.

Therefore, the light source 24c irradiates mainly a front surface of the wafer W and a side surface of the wafer W in contact with the contact pin 23c with light directly from the obliquely upper side of the wafer W. The light source 24c emits also, for example, laser light having arbitrary wavelength from red light in a visible region to an infrared region.

When a plurality of the contact pins 23c are provided, it is desirable to install a plurality of the light sources 24c respectively corresponding to the contact pins 23c.

The controller 30c is configured in the same manner as the controller 30 of the first embodiment described above, except for control of the light source 24c, in place of or in addition to the light sources 24a and 24b.

Figure 8:
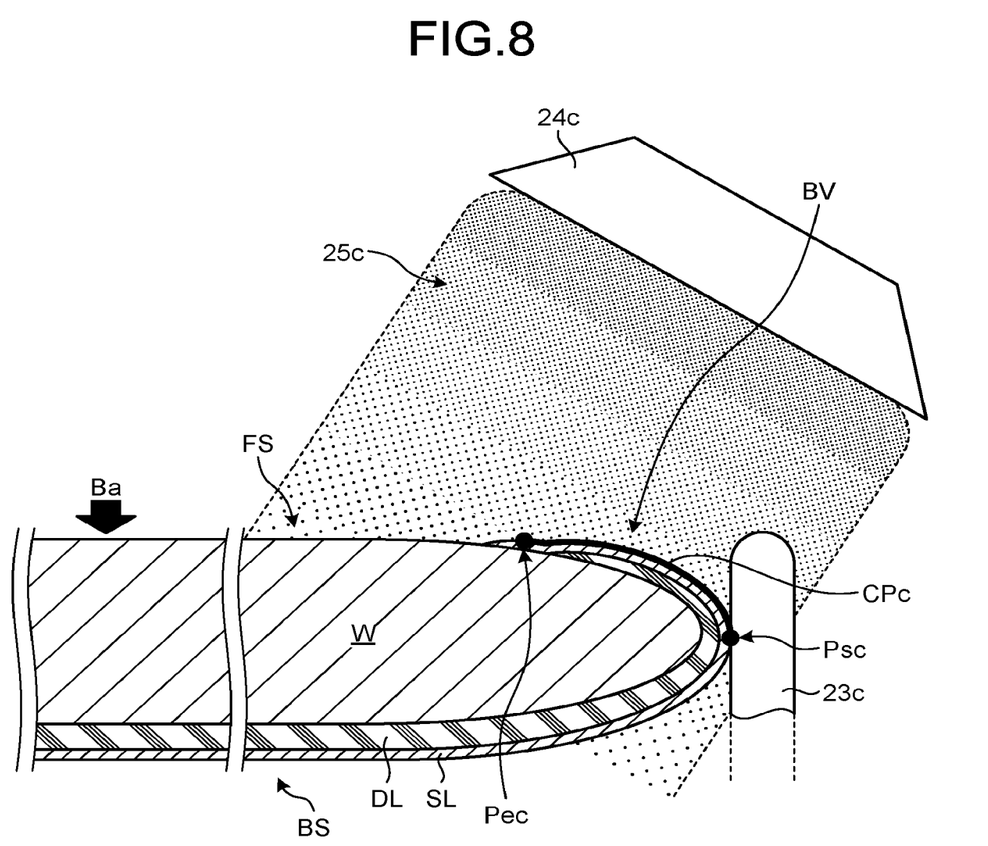
FIG. 8 is a schematic view illustrating a state where the inspection device according to the second embodiment irradiates a wafer with light from a light source.

FIG. 8 is a schematic view illustrating a state where the inspection device 2 according to the second embodiment irradiates the wafer W with light 25c from the light source 24c.

As illustrated in FIG. 8, for example, the wafer W illustrated in FIGS. 5A and 5B described above can be used as an object to be inspected in the inspection device 2 of the second embodiment. As described above, in this wafer W, the area where the semiconductor film SL comes into direct contact with the wafer W without via the insulating film DL is arranged on the front surface FS side of the wafer W.

Therefore, the contact pin 23c is brought into contact with the bevel BV of the wafer W, and the light 25c is emitted by the light source 24c from the obliquely upper side of the wafer W. As a result, an area irradiated with the light 25c from the light source 24c includes a point Psc as a first site where the contact pin 23c and the wafer W are in contact with each other and at least a part of the area where the semiconductor film SL and the wafer W are in direct contact with each other.

The point Psc is located in an area where the semiconductor film SL is formed on the wafer W with the insulating film DL interposed therebetween, and is a point where the wafer W and the contact pin 23c are in contact with each other, which is similar to the point Ps according to the first embodiment described above. However, the point Psc is located on the bevel BV of the wafer W, for example, while the above-described point Ps is located on the back surface BS of the wafer W.

When the light 25c is emitted from the light source 24c as described above, an internal photoelectric effect is generated in the semiconductor film SL in the irradiation area, and the conductivity of the semiconductor film SL is improved. As a result, the point Psc and a point Pec and a conduction path CPc connecting them are formed in the irradiation area of the light 25c on the semiconductor film SL, even if the semiconductor film SL is made of a non-doped silicon that is not doped with any impurity.

The point Pec as a second site is located in the area irradiated with the light 25c from the light source 24c in the area where the semiconductor film SL is in direct contact with the wafer W, and is an arbitrary point where the semiconductor film SL and the wafer W are made conductive. In addition, the point Pec is located on the front surface FS side of the wafer W similarly to the example of FIG. 5B of the first embodiment described above.

As a result, the conduction from the contact pin 23c to the body of the wafer W, which is the semiconductor or the conductor, is obtained, and the predetermined potential is applied from the contact pin 23c to the body of the wafer W. Accordingly, the wafer W is fixed at the predetermined potential during the inspection by the inspection device 2.

As described above, the same effects as those of the inspection device 1 of the first embodiment are achieved according to the inspection device 2 of the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An inspection device comprising:
    a lens barrel that irradiates a substrate having a first main surface on which a pattern is formed with a charged particle;
    a terminal that comes into contact with the substrate at a first site on a second main surface of the substrate or on a side surface of the substrate, and applies a predetermined potential to the substrate; and
    at least one light source that irradiates a predetermined area of the substrate including the first site with light.

2. The inspection device according to claim 1, wherein the terminal comes into contact with the substrate at the first site on the second main surface of the substrate.

3. The inspection device according to claim 2, further comprising
    a stage on which the substrate is placed, wherein
    the stage includes:
    a through hole penetrating the stage in a thickness direction of the stage; and
    a through groove that penetrates the stage in the thickness direction of the stage and leads to an outside of the stage from the through hole.

4. The inspection device according to claim 3, wherein
    the terminal passes through the through hole from a lower side of the stage and comes into contact with the substrate at the first site, and
    the light source includes a first light source that is arranged below the stage and irradiates the substrate with the light through at least one of the through hole and the through groove.

5. The inspection device according to claim 4, wherein
    the light source further includes a second light source that is arranged on a lateral side of the stage and irradiates the substrate with the light directly or through the through groove.

6. The inspection device according to claim 5, wherein
    an irradiation range of the first light source and an irradiation range of the second light source are continuously arranged.

7. The inspection device according to claim 5, wherein
    the substrate includes:
    a body portion made of a conductor or a semiconductor;
    an insulating film extending from the first site to at least the side surface of the substrate and being arranged on the body portion; and
    a semiconductor film extending from the first site to a second site over an end portion of the insulating film, the semiconductor film being arranged on the body portion with the insulating film interposed at the first site and in a state of being in contact with the body portion at the second site, and
    an irradiation range of the light source includes the first site and the second site.

8. The inspection device according to claim 2, wherein
the terminal includes a plurality of terminals that come into contact with the substrate at a plurality of the first sites dotted on the second main surface of the substrate, and the light source includes a plurality of light sources corresponding to the plurality of terminals.

9. The inspection device according to claim 2, wherein the substrate includes:

a body portion made of a conductor or a semiconductor;

an insulating film arranged on the body portion at least on the second main surface of the substrate including the first site; and a semiconductor film extending from the first site to a second site over an end portion of the insulating film, the semiconductor film being arranged on the body portion with the insulating film interposed at the first site and in a state of being in contact with the body portion at the second site, and an irradiation range of the light source includes the first site and the second site.

10. The inspection device according to claim 9, wherein the semiconductor film is made of a non-doped silicon.

11. The inspection device according to claim 9, wherein the second site is included in a bevel of the substrate.

12. The inspection device according to claim 1, wherein the terminal comes into contact with the substrate at the first site on the side surface of the substrate.

13. The inspection device according to claim 12, further comprising a stage on which the substrate is placed, wherein the terminal is arranged to protrude from a surface of the stage on which the substrate is placed toward the substrate, and comes into contact with the substrate on the side surface of the substrate, and the light source is arranged obliquely above the stage.

14. The inspection device according to claim 13, wherein the substrate includes:

a body portion made of a conductor or a semiconductor;

an insulating film extending from the first site to the first main surface of the substrate and being arranged on the body portion; and a semiconductor film extending from the first site to a second site over an end portion of the insulating film, the semiconductor film being arranged on the body portion with the insulating film interposed at the first site and in a state of being in contact with the body portion at the second site, and an irradiation range of the light source includes the first site and the second site.

15. The inspection device according to claim 14, wherein the semiconductor film is made of a non-doped silicon.

16. The inspection device according to claim 14, wherein the second site is included in a bevel of the substrate.

17. The inspection device according to claim 12, wherein the terminal includes a plurality of terminals that come into contact with the substrate at a plurality of the first sites dotted on the side surface of the substrate, and the light source includes a plurality of light sources corresponding to the plurality of terminals.

18. The inspection device according to claim 1, further comprising a stage on which the substrate is placed, wherein the light source is installed on the stage.

19. The inspection device according to claim 1, wherein the light source emits laser light having an arbitrary wavelength from red light in a visible region to an infrared region.

20. The inspection device according to claim 1, further comprising a control device that controls the lens barrel, the terminal, and the light source, wherein the control device causes the substrate to be irradiated with an incident electron beam from the lens barrel in a state where the terminal is brought into contact with the substrate and the substrate is irradiated with the light from the light source.

* * * * *